(12) United States Patent
Liu

(10) Patent No.: US 11,315,330 B1
(45) Date of Patent: *Apr. 26, 2022

(54) SENSOR SYSTEM BASED ON STACKED SENSOR LAYERS

(71) Applicant: Facebook Technologies, LLC, Menlo Park, CA (US)

(72) Inventor: Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/910,844

(22) Filed: Jun. 24, 2020

Related U.S. Application Data

(63) Continuation of application No. 15/909,162, filed on Mar. 1, 2018, now Pat. No. 10,726,627.

(Continued)

(51) Int. Cl.
*G06T 19/00* (2011.01)
*G06T 7/73* (2017.01)
(Continued)

(52) U.S. Cl.
CPC .......... *G06T 19/006* (2013.01); *G02B 27/017* (2013.01); *G02B 27/0172* (2013.01); *G06F 3/013* (2013.01); *G06K 9/00201* (2013.01); *G06K 9/00208* (2013.01); *G06K 9/00671* (2013.01); *G06K 9/00986* (2013.01); *G06K 9/4628* (2013.01); *G06K 9/627* (2013.01); *G06K 9/6256* (2013.01); *G06K 9/6268* (2013.01);
(Continued)

(58) Field of Classification Search
None
See application file for complete search history.

(56) References Cited

U.S. PATENT DOCUMENTS

| 7,362,365 B1 | 4/2008 | Reyneri et al. |
| 8,134,623 B2 | 3/2012 | Purcell et al. |

(Continued)

FOREIGN PATENT DOCUMENTS

| CN | 103207716 A | 7/2013 |
| CN | 104125418 A | 10/2014 |

(Continued)

OTHER PUBLICATIONS

U.S. Appl. No. 15/909,162, "Non-Final Office Action", dated Jul. 25, 2019, 20 pages.

(Continued)

*Primary Examiner* — Peter Hoang
(74) *Attorney, Agent, or Firm* — Kilpatrick Townsend & Stockton LLP

(57) ABSTRACT

A sensor assembly for determining one or more features of a local area is presented herein. The sensor assembly includes a plurality of stacked sensor layers. A first sensor layer of the plurality of stacked sensor layers located on top of the sensor assembly includes an array of pixels. The top sensor layer can be configured to capture one or more images of light reflected from one or more objects in the local area. The sensor assembly further includes one or more sensor layers located beneath the top sensor layer. The one or more sensor layers can be configured to process data related to the captured one or more images. A plurality of sensor assemblies can be integrated into an artificial reality system, e.g., a head-mounted display.

20 Claims, 8 Drawing Sheets

Related U.S. Application Data

(60) Provisional application No. 62/536,605, filed on Jul. 25, 2017.

(51) Int. Cl.
  G06K 9/62 (2006.01)
  G06K 9/64 (2006.01)
  G02B 27/01 (2006.01)
  G06K 9/00 (2006.01)
  G06K 9/46 (2006.01)
  G06F 3/01 (2006.01)
  H04N 5/378 (2011.01)
  H01L 27/146 (2006.01)
  H01L 31/0352 (2006.01)
  H01L 31/0384 (2006.01)
  H01L 27/28 (2006.01)
  H01L 27/30 (2006.01)

(52) U.S. Cl.
  CPC ............... G06K 9/645 (2013.01); G06T 7/73 (2017.01); G02B 2027/011 (2013.01); G02B 2027/014 (2013.01); G02B 2027/0138 (2013.01); G02B 2027/0178 (2013.01); G06T 2207/20084 (2013.01); H01L 27/14627 (2013.01); H01L 27/14634 (2013.01); H01L 27/14636 (2013.01); H01L 27/14643 (2013.01); H01L 27/14665 (2013.01); H01L 27/286 (2013.01); H01L 27/307 (2013.01); H01L 31/03845 (2013.01); H01L 31/035218 (2013.01); H04N 5/378 (2013.01)

(56) References Cited

U.S. PATENT DOCUMENTS

| | | |
|---|---|---|
| 8,779,346 B2 | 7/2014 | Fowler et al. |
| 9,001,251 B2 | 4/2015 | Smith et al. |
| 9,094,629 B2 | 7/2015 | Ishibashi |
| 9,282,264 B2 | 3/2016 | Park et al. |
| 9,363,454 B2 | 6/2016 | Ito et al. |
| 10,726,627 B2 | 7/2020 | Liu |
| 2003/0020100 A1 | 1/2003 | Guidash |
| 2005/0057389 A1 | 3/2005 | Krymski |
| 2007/0222881 A1 | 9/2007 | Mentzer |
| 2009/0244346 A1 | 10/2009 | Funaki |
| 2009/0245637 A1 | 10/2009 | Barman et al. |
| 2009/0321615 A1 | 12/2009 | Sugiyama et al. |
| 2010/0276572 A1 | 11/2010 | Iwabuchi et al. |
| 2011/0254986 A1 | 10/2011 | Nishimura et al. |
| 2012/0133807 A1 | 5/2012 | Wu et al. |
| 2012/0212465 A1 | 8/2012 | White et al. |
| 2012/0262616 A1 | 10/2012 | Sa et al. |
| 2013/0056809 A1 | 3/2013 | Mao et al. |
| 2013/0057742 A1 | 3/2013 | Nakamura et al. |
| 2013/0141619 A1 | 6/2013 | Lim et al. |
| 2013/0207219 A1 | 8/2013 | Ahn |
| 2013/0299674 A1 | 11/2013 | Fowler et al. |
| 2014/0042299 A1 | 2/2014 | Wan et al. |
| 2014/0368687 A1 | 12/2014 | Yu et al. |
| 2015/0189209 A1 | 7/2015 | Yang et al. |
| 2015/0201142 A1 | 7/2015 | Smith et al. |
| 2015/0229859 A1 | 8/2015 | Guidash et al. |
| 2015/0279884 A1 | 10/2015 | Kusumoto |
| 2015/0309316 A1 | 10/2015 | Osterhout et al. |
| 2015/0312502 A1 | 10/2015 | Borremans |
| 2015/0358571 A1 | 12/2015 | Dominguez Castro et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0028974 A1 | 1/2016 | Guidash et al. |
| 2016/0088253 A1 | 3/2016 | Tezuka |
| 2016/0100115 A1 | 4/2016 | Kusano |
| 2016/0165160 A1 | 6/2016 | Hseih et al. |
| 2016/0197117 A1 | 7/2016 | Nakata et al. |
| 2016/0360127 A1 | 12/2016 | Dierickx et al. |
| 2017/0039906 A1 | 2/2017 | Jepsen |
| 2017/0228345 A1 | 8/2017 | Gupta et al. |
| 2017/0272768 A1 | 9/2017 | Tall et al. |
| 2017/0280031 A1 | 9/2017 | Price et al. |
| 2017/0324917 A1 | 11/2017 | Mlinar et al. |
| 2017/0339327 A1 | 11/2017 | Koshkin et al. |
| 2018/0136471 A1 | 5/2018 | Miller et al. |
| 2018/0167575 A1 | 6/2018 | Watanabe |
| 2018/0276841 A1 | 9/2018 | Krishnaswamy et al. |
| 2019/0035154 A1 | 1/2019 | Liu |
| 2019/0098232 A1 | 3/2019 | Mori et al. |
| 2020/0053299 A1 | 2/2020 | Zhang et al. |

FOREIGN PATENT DOCUMENTS

| | | |
|---|---|---|
| CN | 104204904 A | 12/2014 |
| CN | 104704812 A | 6/2015 |
| CN | 105706439 A | 6/2016 |
| CN | 106255978 A | 12/2016 |
| CN | 106791504 A | 5/2017 |
| CN | 109298528 A | 2/2019 |
| EP | 1746820 A1 | 1/2007 |
| EP | 2804074 A2 | 11/2014 |
| WO | 2014055391 A2 | 4/2014 |
| WO | 2017013806 A1 | 1/2017 |

OTHER PUBLICATIONS

U.S. Appl. No. 15/909,162, "Notice of Allowance", dated Mar. 18, 2020, 9 pages.
Extended European Patent Search Report, dated Sep. 30, 2020, 9 pages.
U.S. Appl. No. 15/847,517, "Non-Final Office Action", dated Nov. 23, 2018, 21 pages.
U.S. Appl. No. 16/255,528, "Non-Final Office Action", dated Jul. 10, 2020, 27 pages.
Cho, et al., "A Low Power Dual CDS for a col. Parallel CMOS Image Sensor", Journal of Semiconductor Technology and Science, vol. 12, No. 4, Dec. 30, 2012, pp. 388-396.
EP18179838.0, "Partial European Search Report", dated Dec. 5, 2018, 14 pages.
EP18179846.3, "Extended European Search Report", dated Dec. 7, 2018, 10 pages.
EP18179851.3, "Extended European Search Report", dated Dec. 7, 2018, 8 pages.
PCT/US2018/039350, "International Search Report and Written Opinion", dated Nov. 15, 2018, 13 pages.
PCT/US2018/039352, "International Search Report and Written Opinion", dated Oct. 26, 2018, 10 pages.
PCT/US2018/039431, "International Search Report and Written Opinion", dated Nov. 7, 2018, 14 pages.
Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.
Corrected Notice of Allowability dated Apr. 9, 2021 for U.S. Appl. No. 16/255,528, filed Jan. 23, 2019, 5 Pages.
Final Office Action dated Jan. 27, 2021 for U.S. Appl. No. 16/255,528, filed Jan. 23, 2019, 31 Pages.
International Preliminary Report on Patentability for International Application No. PCT/US2020/014904, dated Aug. 6, 2020, 6 Pages.
International Search Report and Written Opinion for International Application No. PCT/US2019/014904, dated Aug. 5, 2019, 7 Pages.
International Search Report and Written Opinion for International Application No. PCT/US2021/031201, dated Aug. 2, 2021, 13 Pages.
Millet L., et al., "A 5500-Frames/s 85-GOPS/W 3-D Stacked BSI Vision Chip Based on Parallel In-Focal-Plane Acquisition and

(56) References Cited

OTHER PUBLICATIONS

Processing," IEEE Journal of Solid-State Circuits, USA, Apr. 1, 2019, vol. 54 (4), pp. 1096-1105, XP011716786.
Notice of Allowance dated Apr. 1, 2021 for U.S. Appl. No. 16/255,528, filed Jan. 23, 2019, 7 Pages.
Notification of the First Office Action dated Oct. 28, 2021 for Chinese Application No. 2019800218483, filed Jan. 24, 2019, 17 pages.
Office Action dated Jul. 3, 2020 for Chinese Application No. 201810821296, filed Jul. 24, 2018, 17 Pages.
Office Action dated Mar. 9, 2021 for Chinese Application No. 201810821296, filed Jul. 24, 2018, 10 Pages.
Office Action dated Jun. 28, 2020 for Chinese Application No. 201810821296, filed Jul. 24, 2018, 2 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.

SENSOR SYSTEM BASED ON STACKED SENSOR LAYERS

CROSS-REFERENCES TO RELATED APPLICATIONS

This application is a continuation of U.S. Non-Provisional patent application Ser. No. 15/909,162, filed Mar. 1, 2018, which claims benefit of U.S. Provisional Patent Application Ser. No. 62/536,605, filed Jul. 25, 2017, which are hereby incorporated by reference in their entirety.

TECHNICAL FIELD

The present disclosure generally relates to implementation of sensor devices, and specifically relates a sensor system comprising a plurality of stacked sensor layers that can be part of an artificial reality system.

BACKGROUND

Artificial reality systems such as head-mounted display (HMD) systems employ complex sensor devices (cameras) for capturing features of objects in a surrounding area in order to provide satisfactory user experience. A limited number of conventional sensor devices can be implemented in a HMD system and utilized for, e.g., eye tracking, hand tracking, body tracking, scanning of a surrounding area with a wide field-of-view, etc. Most of the time, the conventional sensor devices capture a large amount of information from the surrounding area. Due to processing a large amount of data, the conventional sensor devices can be easily saturated negatively affecting processing speed. Furthermore, the conventional sensor devices employed in artificial reality systems dissipate a large amount of power while having a prohibitively large latency due to performing computationally intensive operations.

SUMMARY

A sensor assembly for determining one or more features of a local area surrounding some or all of the sensor assembly is presented herein. The sensor assembly includes a plurality of stacked sensor layers, i.e., sensor layers stacked on top of each other. A first sensor layer of the plurality of stacked sensor layers located on top of the sensor assembly can be implemented as a photodetector layer and includes an array of pixels. The top sensor layer can be configured to capture one or more images of light reflected from one or more objects in the local area. The sensor assembly further includes one or more sensor layers located beneath the photodetector layer. The one or more sensor layers can be configured to process data related to the captured one or more images for determining the one or more features of the local area, e.g., depth information for the one or more objects, an image classifier, etc.

A head-mounted display (HMD) can further integrate a plurality of sensor assemblies. The HMD displays content to a user wearing the HMD. The HMD may be part of an artificial reality system. The HMD further incudes an electronic display, at least one illumination source and an optical assembly. The electronic display is configured to emit image light. The at least one illumination source is configured to illuminate the local area with light captured by at least one sensor assembly of the plurality of sensor assemblies. The optical assembly is configured to direct the image light to an eye box of the HMD corresponding to a location of a user's eye. The image light may comprise depth information for the local area determined by the at least one sensor assembly based in part on the processed data related to the captured one or more images.

Figure 1A:
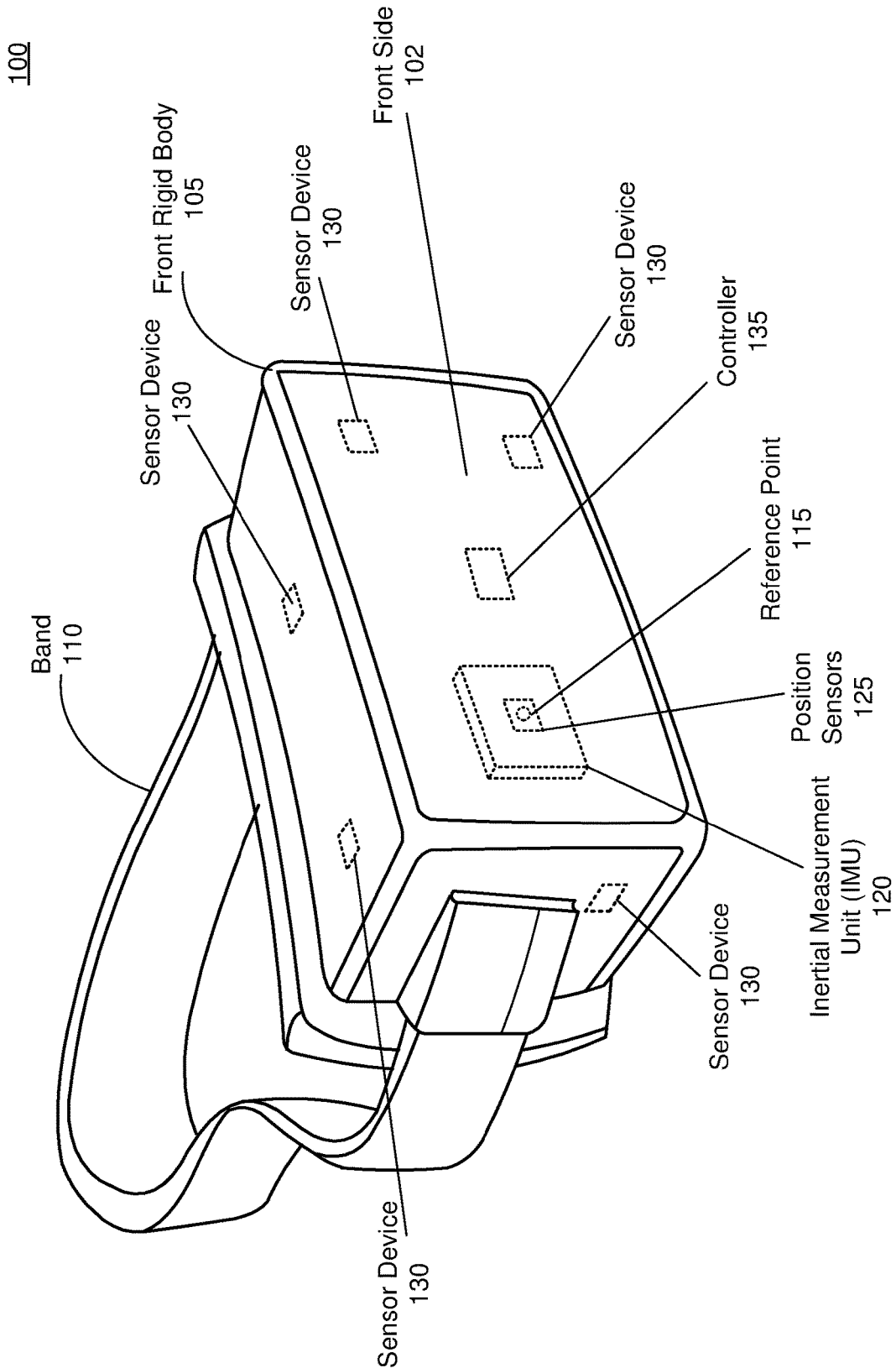
FIG. 1A is a diagram of a head-mounted display (HMD), in accordance with one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Embodiments of the present disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD near-eye display (NED), a mobile device or computing system, or any other hardware platform capable of providing artificial reality content to one or more viewers.

A stacked sensor system for determining various features of an environment is presented herein, which may be integrated into an artificial reality system. The stacked sensor system includes a plurality of stacked sensor layers. Each sensor layer of the plurality of stacked sensor layers may represent a signal processing layer for performing a specific signal processing function. Analog sensor data related to intensities of light reflected from the environment can be captured by a photodetector layer located on top of the stacked sensor system. The captured analog sensor data can be converted from analog domain to digital domain, e.g., via an analog-to-digital conversion (ADC) layer located beneath the photodetector layer. The digital sensor data can be then provided to at least one signal processing layer of the stacked sensor system located beneath the ADC layer. The at least one signal processing layer would process the digital sensor data to determine one or more features of the environment.

In some embodiments, a plurality of stacked sensor systems is integrated into a HMD. The stacked sensor systems (e.g., sensor devices) may capture data describing various features of an environment, including depth information of a local area surrounding some or all of the HMD. The HMD displays content to a user wearing the HMD. The HMD may be part of an artificial reality system. The HMD further includes an electronic display and an optical assembly. The electronic display is configured to emit image light. The optical assembly is configured to direct the image light to an eye box of the HMD corresponding to a location of a user's eye. The image light may comprise the depth information for the local area determined by at least one of the plurality of stacked sensor systems.

In some other embodiments, a plurality of stacked sensor systems can be integrated into an eyeglass-type platform representing a NED. The NED may be part of an artificial reality system. The NED presents media to a user. Examples of media presented by the NED include one or more images, video, audio, or some combination thereof. The NED further includes an electronic display and an optical assembly. The electronic display is configured to emit image light. The optical assembly is configured to direct the image light to an eye box of the NED corresponding to a location of a user's eye. The image light may comprise the depth information for the local area determined by at least one of the plurality of stacked sensor systems.

FIG. 1A is a diagram of a HMD 100, in accordance with one or more embodiments. The HMD 100 may be part of an artificial reality system. In embodiments that describe AR system and/or a MR system, portions of a front side 102 of the HMD 100 are at least partially transparent in the visible band (~380 nm to 750 nm), and portions of the HMD 100 that are between the front side 102 of the HMD 100 and an eye of the user are at least partially transparent (e.g., a partially transparent electronic display). The HMD 100 includes a front rigid body 105, a band 110, and a reference point 115.

The front rigid body 105 includes one or more electronic display elements (not shown in FIG. 1A), one or more integrated eye tracking systems (not shown in FIG. 1A), an Inertial Measurement Unit (IMU) 120, one or more position sensors 125, and the reference point 115. In the embodiment shown by FIG. 1A, the position sensors 125 are located within the IMU 120, and neither the IMU 120 nor the position sensors 125 are visible to a user of the HMD 100. The IMU 120 is an electronic device that generates IMU data based on measurement signals received from one or more of the position sensors 125. A position sensor 125 generates one or more measurement signals in response to motion of the HMD 100. Examples of position sensors 125 include: one or more accelerometers, one or more gyroscopes, one or more magnetometers, another suitable type of sensor that detects motion, a type of sensor used for error correction of the IMU 120, or some combination thereof. The position sensors 125 may be located external to the IMU 120, internal to the IMU 120, or some combination thereof.

The HMD 100 includes a distributed network of sensor devices (cameras) 130, which may be embedded into the front rigid body 105. Note that, although not shown in FIG. 1A, at least one sensor device 130 may be also embedded into the band 110. Each sensor device 130 may be implemented as a camera of a relatively small size. The distributed network of sensor devices 130 may replace a plurality of large conventional cameras. In some embodiments, each sensor device 130 of the distributed network embedded in the HMD 100 is implemented as a tiny chip camera with a limited predefined resolution, e.g., each sensor device 130 may include an array of 100×100 pixels or an array of 200×200 pixels. In some embodiments, each sensor device 130 in the distributed network has a field-of-view that does not overlap with a field-of-view of any other sensor device 130 integrated into the HMD 100. This is in contrast to overlapping field-of-views of large conventional cameras, which may cause capturing a large amount of overlapping data from a surrounding area. The HMD 100 may also include an imaging aperture associated with each sensor device 130 (not shown in FIG. 1A). A sensor device 130 may capture light reflected from the surrounding area through the imaging aperture.

Note that it would be impractical for each sensor device 130 in the distributed network of sensor devices 130 to have its own direct link (bus) to a central processing unit (CPU) or a controller 135 embedded into the HMD 100. Instead, each individual sensor device 130 may be coupled to the controller 135 via a shared bus (not shown in FIG. 1A) in a scalable manner, thus providing a scalable network of sensor devices 130 embedded into the HMD 100. The scalable network of sensor devices 130 can be viewed as a redundant system. Combined together, the sensor devices 130 cover a much larger field-of-view (e.g., 360 degrees) than typically deployed by large conventional cameras (e.g., 180 degrees). The wider field-of-view obtained by the sensor devices 130 provides increased robustness.

Note that it is not required to always keep active (i.e., turned on) all the sensor devices 130 embedded into the HMD 100. In some embodiments, the controller 135 is configured to dynamically activate a first subset of the sensor devices 130 and deactivate a second subset of the sensor devices 130, e.g., based on a specific situation. In one or more embodiments, depending on a particular simulation running on the HMD 100, the controller 135 may deactivate a certain portion of the sensor devices 130. For example, after locating a preferred part of an environment for scanning, specific sensor devices 130 can remain active, whereas other sensor devices 130 can be deactivated in order to save power dissipated by the distributed network of sensor devices 130.

A sensor device 130 or a group of sensor devices 130 can, e.g., track, during a time period, one or more moving objects and specific features related to the one or more moving objects. The features related to the moving objects obtained during the time period may be then passed to another sensor device 130 or another group of sensor devices 130 for continuous tracking during a following time period, e.g., based on instructions from the controller 135. For example, the HMD 100 may use the extracted features in the scene as a "land marker" for user localization and head pose tracking in a three-dimensional world. A feature associated with a user's head may be extracted by, e.g., one sensor device 130 at a time instant. In a next time instant, the user's head may move and another sensor device 130 may be activated to locate the same feature for performing head tracking. The controller 135 may be configured to predict which new sensor device 130 could potentially capture the same feature of a moving object (e.g., the user's head). In one or more embodiments, the controller 135 may utilize the IMU data obtained by the IMU 120 to perform coarse prediction. In this scenario, information about the tracked feature may be passed from one sensor device 130 to another sensor device 130, e.g., based on the coarse prediction. A number of active sensor devices 130 may be dynamically adjusted (e.g., based on instructions from the controller 135) in accordance with a specific task performed at a particular time instant. Furthermore, one sensor device 130 can perform an extraction of a particular feature of an environment and provide extracted feature data to the controller 135 for further processing and passing to another sensor device 130. Thus, each sensor device 130 in the distributed network of sensor devices 130 may process a limited amount of data. In contrast, conventional sensor devices integrated into a HMD system typically perform continuous processing of large amounts of data, which consumes much more power.

In some embodiments, each sensor device 130 integrated into the HMD 100 can be configured for a specific type of processing. For example, at least one sensor device 130 can be customized for tracking various features of an environment, e.g., determining sharp corners, hand tracking, etc. Furthermore, each sensor device 130 can be customized to detect one or more particular landmark features, while ignoring other features. In some embodiments, each sensor device 130 can perform early processing that provides information about a particular feature, e.g., coordinates of a feature and feature description. To support the early processing, certain processing circuitry may be incorporated into the sensor device 130, as discussed in more detail in conjunction with FIGS. 2-5. The sensor device 130 can then pass, e.g., to the controller 135, data obtained based upon the early processing, thus reducing an amount of data being communicated between the sensor device 130 and the controller 135. In this way, a frame rate of the sensor device 130 can increase while preserving a bandwidth requirement between the sensor device 130 and the controller 135. Furthermore, power dissipation and processing latency of the controller 135 can be reduced as partial processing is performed at the sensor device 130, and computational burden of the controller 135 is reduced and distributed to one or more sensor devices 130. Another advantage of the partial and early processing performed at the sensor device 130 includes reduction in memory requirement for storage of image frames on an internal memory of the controller 135 (not shown in FIG. 1A). Additionally, power consumption at the controller 135 may be reduced as less memory access leads to a lower power dissipation.

In an embodiment, a sensor device 130 can include an array of 100×100 pixels or an array of 200×200 pixels coupled to processing circuitry customized for extracting of, e.g., up to 10 features of an environment surrounding some or all of the HMD 100. In another embodiment, processing circuitry of a sensor device 130 can be customized to operate as a neural network trained to track, e.g., up to 20 joint locations of a user's hand, which may be required for performing accurate hand tracking. In yet other embodiment, at least one sensor device 130 can be employed for face tracking where, e.g., a user's mouth and facial movements can be captured. In this case, the at least one sensor device 130 can be oriented downward to facilitate tracking of user's facial features.

Note that each sensor device 130 integrated into the HMD 100 may provide a level of signal-to-noise ratio (SNR) above a threshold level defined for that sensor device 130. Because a sensor device 130 is customized for a particular task, sensitivity of the customized sensor device 130 can be improved in comparison with conventional cameras. Also note that the distributed network of sensor devices 130 is a redundant system and it is possible to select (e.g., by the controller 135) a sensor device 130 of the distributed network that produces a preferred level of SNR. In this manner, tracking accuracy and robustness of the distributed network of sensor devices 130 can be greatly improved. Each sensor device 130 may be also configured to operate in an extended wavelength range, e.g., in the infrared and/or visible spectrum.

In some embodiments, a sensor device 130 includes a photodetector layer with an array of silicon-based photodiodes. In alternate embodiments, a photodetector layer of a sensor device 130 can be implemented using a material and technology that is not silicon based, which may provide improved sensitivity and wavelength range. In one embodiment, a photodetector layer of a sensor device 130 is based on an organic photonic film (OPF) photodetector material suitable for capturing light having wavelengths larger than 1000 nm. In another embodiment, a photodetector layer of a sensor device 130 is based on Quantum Dot (QD) photodetector material. A QD-based sensor device 130 can be suitable for, e.g., integration into AR systems and applications related to outdoor environments at low visibility (e.g., at night). Available ambient light is then mostly located in the long wavelength non-visible range between, e.g., approximately 1 μm and 2.5 μm, i.e., in the short wave infrared range. The photodetector layer of the sensor device 130 implemented based on an optimized QD film can detect both visible and short wave infrared light, whereas the silicon based film may be sensitive only to wavelengths of light around approximately 1.1 μm.

In some embodiments, the controller 135 embedded into the front rigid body 105 and coupled to the sensor devices 130 of the distributed sensor network is configured to combine captured information from the sensor devices 130. The controller 135 may be configured to properly integrate data associated with different features collected by different sensor devices 130. In some embodiments, the controller 135 determines depth information for one or more objects in a local area surrounding some or all of the HMD 100, based on the data captured by one or more of the sensor devices 130.

Figure 1B:
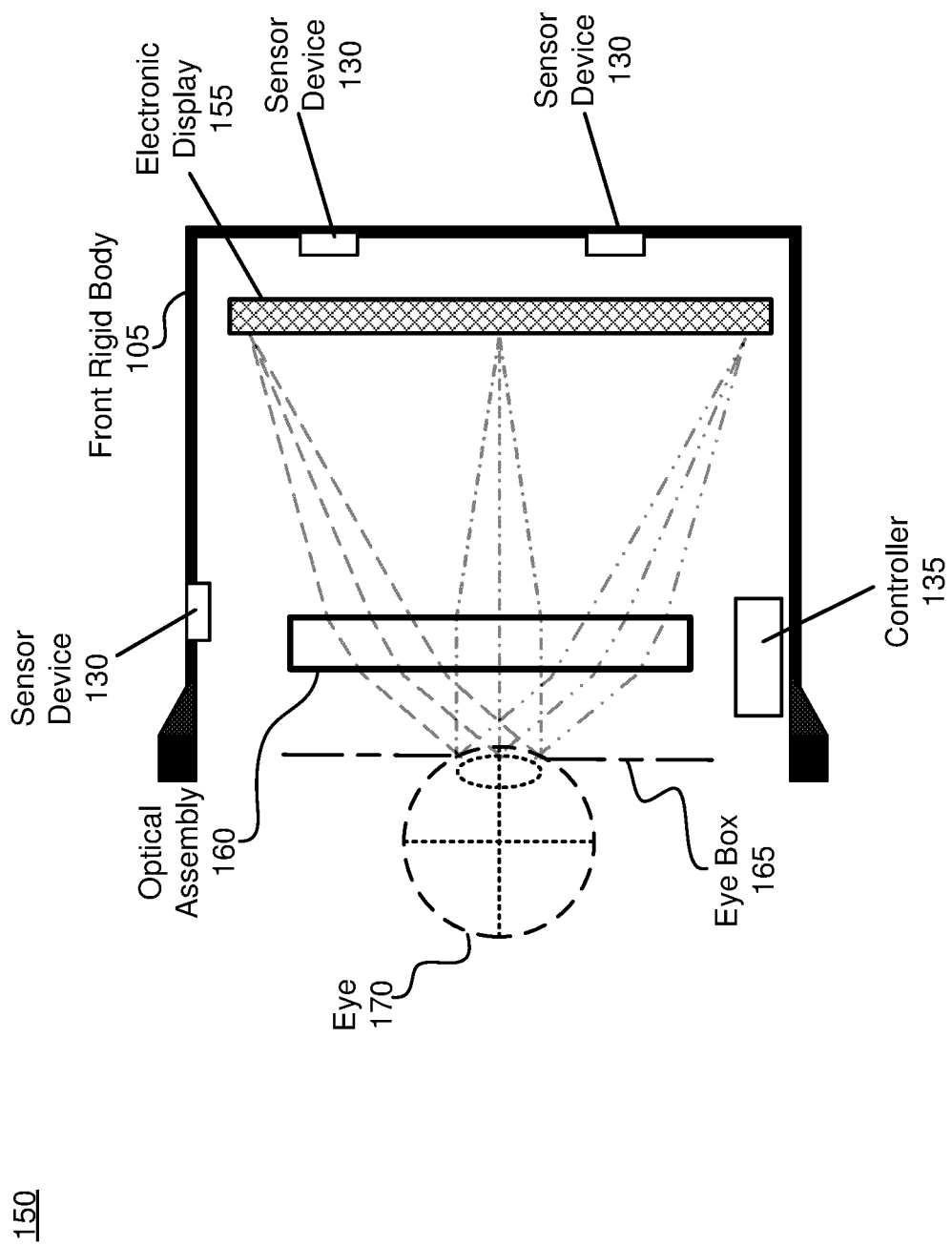
FIG. 1B is a cross section of a front rigid body of the HMD in FIG. 1A, in accordance with one or more embodiments.

FIG. 1B is a cross section 150 of the front rigid body 105 of the HMD 100 shown in FIG. 1A, in accordance with one or more embodiments. The front rigid body 105 includes the sensor devices 130, the controller 135 coupled to the sensor devices 130, an electronic display 155 and an optical assembly 160. The electronic display 155 and the optical assembly 160 together provide image light to an eye box 165. The eye box 165 is a region in space that is occupied by a user's eye 170. For purposes of illustration, FIG. 1B shows a cross section 150 associated with a single eye 170, but another optical assembly 160, separate from the optical assembly 160, provides altered image light to another eye of the user.

The electronic display 155 emits image light toward the optical assembly 160. In various embodiments, the electronic display 155 may comprise a single electronic display or multiple electronic displays (e.g., a display for each eye of a user). Examples of the electronic display 155 include: a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, some other display, a projector, or some combination thereof. The electronic display 155 may also include an aperture, a Fresnel lens, a convex lens, a concave lens, a diffractive element, a waveguide, a filter, a polarizer, a diffuser, a fiber taper, a reflective surface, a polarizing reflective surface, or any other suitable optical element that affects the image light emitted from the electronic display 155. In some embodiments, the electronic display 155 may have one or more coatings, such as anti-reflective coatings.

The optical assembly 160 receives image light emitted from the electronic display 155 and directs the image light to the eye box 165 of the user's eye 170. The optical assembly 160 also magnifies the received image light, corrects optical aberrations associated with the image light, and the corrected image light is presented to a user of the HMD 100. In some embodiments, the optical assembly 160 includes a collimation element (lens) for collimating beams of image light emitted from the electronic display 155. At least one optical element of the optical assembly 160 may be an aperture, a Fresnel lens, a refractive lens, a reflective surface, a diffractive element, a waveguide, a filter, or any other suitable optical element that affects image light emitted from the electronic display 155. Moreover, the optical assembly 160 may include combinations of different optical elements. In some embodiments, one or more of the optical elements in the optical assembly 160 may have one or more coatings, such as anti-reflective coatings, dichroic coatings, etc. Magnification of the image light by the optical assembly 160 allows elements of the electronic display 155 to be physically smaller, weigh less, and consume less power than larger displays. Additionally, magnification may increase a field-of-view of the displayed media. For example, the field-of-view of the displayed media is such that the displayed media is presented using almost all (e.g., 110 degrees diagonal), and in some cases all, of the user's field-of-view. In some embodiments, the optical assembly 160 is designed so its effective focal length is larger than the spacing to the electronic display 155, which magnifies the image light projected by the electronic display 155. Additionally, in some embodiments, the amount of magnification may be adjusted by adding or removing optical elements.

In some embodiments, the front rigid body 105 further comprises an eye tracking system (not shown in FIG. 1B) that determines eye tracking information for the user's eye 170. The determined eye tracking information may comprise information about a position (including orientation) of the user's eye 170 in the eye box 165, i.e., information about an angle of an eye-gaze. In one embodiment, the eye tracking system illuminates the user's eye 170 with structured light. The eye tracking system can determine the position of the user's eye 170 based on deformations in a pattern of structured light reflected from a surface of the user's eye and captured by a camera of the eye tracking system. In another embodiment, the eye tracking system determines the position of the user's eye 170 based on magnitudes of image light captured over a plurality of time instants.

In some embodiments, the front rigid body 105 further comprises a varifocal module (not shown in FIG. 1B). The varifocal module may adjust focus of one or more images displayed on the electronic display 155, based on the eye tracking information obtained from the eye tracking system. In one embodiment, the varifocal module adjusts focus of the displayed images and mitigates vergence-accommodation conflict by adjusting a focal distance of the optical assembly 160 based on the determined eye tracking information. In other embodiment, the varifocal module adjusts focus of the displayed images by performing foveated rendering of the one or more images based on the determined eye tracking information.

Figure 2:
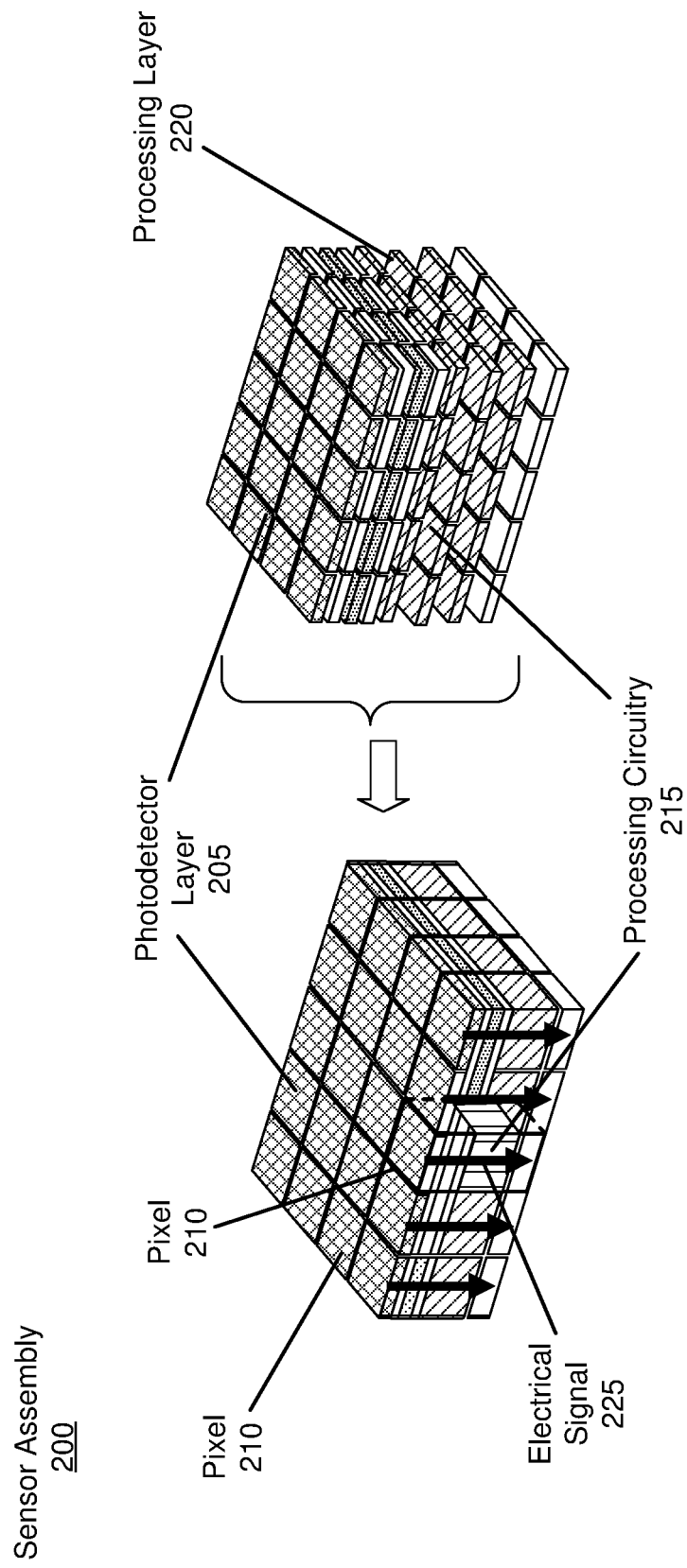
FIG. 2 is a cross-sectional view of a stacked sensor system with a plurality of stacked sensor layers, which may be part of the HMD in FIG. 1A, in accordance with one or more embodiments.

FIG. 2 is a cross-sectional view of a sensor assembly 200 with a plurality of stacked sensor layers, in accordance with one or more embodiments. The sensor assembly 200 may be an embodiment of a sensor device 130 of the HMD 100 in FIG. 1A In some embodiments, the sensor assembly 200 includes a plurality of layers of silicon stacked on top of each other. In alternate embodiments, at least one layer in the plurality of stacked sensor layers of the sensor assembly 200 is implemented based on a non-silicon photo-detection material. A top sensor layer in the sensor assembly 200 may be customized for photo-detection and can be referred to as a photodetector layer 205. The photodetector layer 205 may comprise a two-dimensional array of pixels 210. Each pixel 210 of the photodetector layer 205 may be directly coupled, e.g., via copper bonding (not shown in FIG. 2), with processing circuitry 215 of a processing layer 220 located within the sensor assembly 200 beneath the photodetector layer 205.

Stacking of multiple sensor layers (wafers) as shown in FIG. 2 allows copper bonding between the photodetector layer 205 and the processing layer 220 on per pixel resolution. By putting two wafers face to face, a copper pad connection from one wafer in the sensor assembly 200 to another wafer in the sensor assembly 200 can be made at per pixel level, i.e., an electrical signal 225 corresponding to a single pixel can be sent from the photodetector layer 205 to the processing circuitry 215 of the processing layer 220. In one or more embodiments, an interconnection between the processing layer 220 and at least one other layer in a multiple stacked structure of the sensor assembly 200 can be achieved using, e.g., "through silicon via" (TSV) technology. Due to TSV's geometry size (e.g., around 10 μm), the interconnection between the processing layer 220 and the at least one other layer of the sensor assembly 200 is not at a pixel level, but can still be very dense.

In some embodiments, by employing wafer scaling, the sensor assembly 200 of a small size can be efficiently implemented. For example, a wafer of the photodetector layer 205 can be implemented using, e.g., 45 nm process technology, whereas a wafer of the processing layer 220 can be implemented using more advanced process technology, e.g., 28 nm process technology. Since a transistor in the 28 nm process technology occupies a very small area, a large number of transistors can be fit into a small area of the processing layer 220. In the illustrative embodiment, the sensor assembly 200 can be implemented as a cube of 1 mm×1 mm×1 mm having a power dissipation of approximately 10 mW. In comparison, conventional sensors (cameras) comprise a photodetector pixel array and processing circuitry implemented on a single silicon layer, and a total sensor area is determined as a sum of areas of all functional blocks. Without the benefit of vertical stacking as in the embodiment shown in FIG. 2, the conventional sensors occupy much larger areas than the sensor assembly 200.

Figure 3:
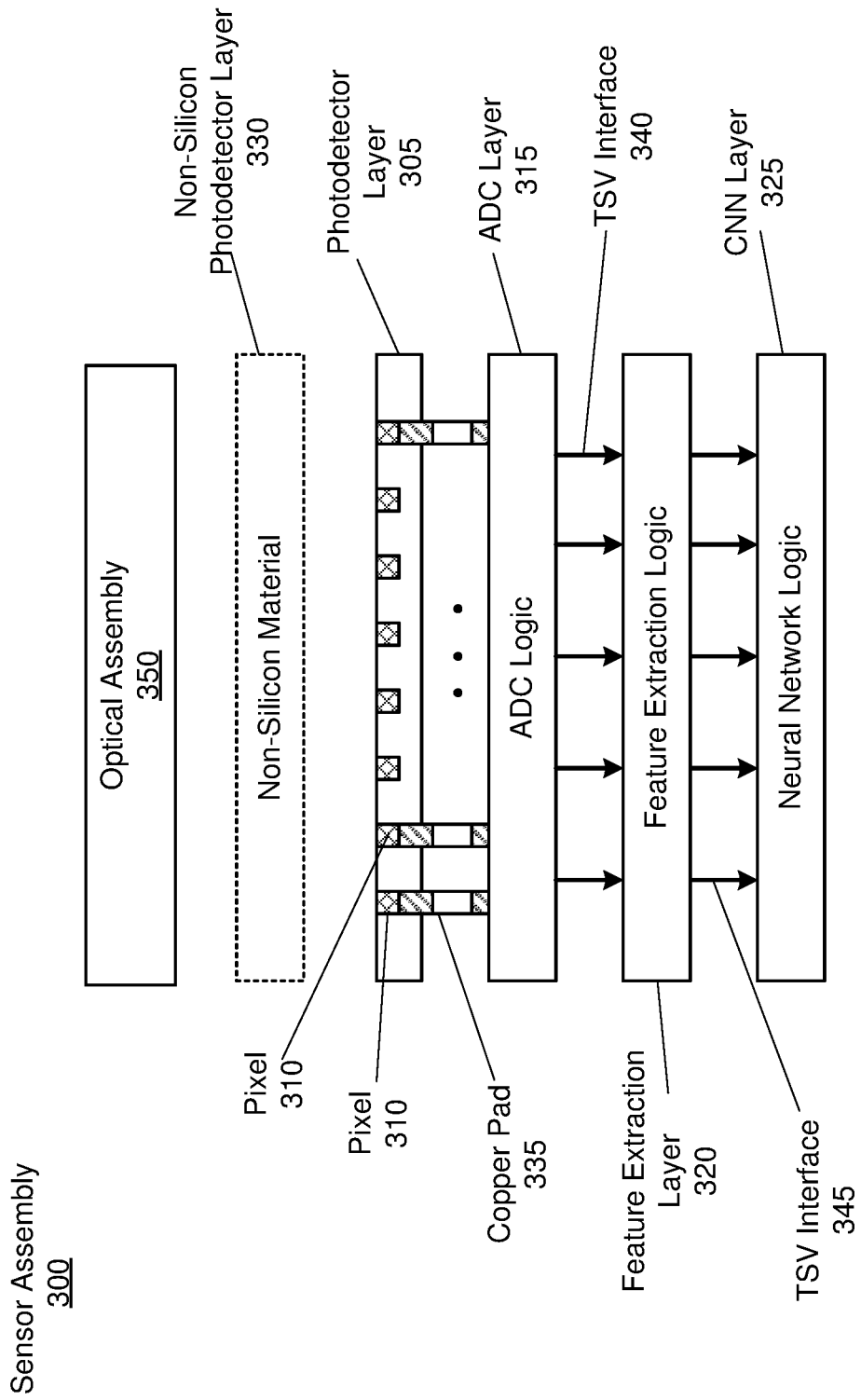
FIG. 3 is a detailed view of a plurality of stacked sensor layers, which may be part of the stacked sensor system in FIG. 2, in accordance with one or more embodiments.

FIG. 3 is a detailed view of a sensor assembly 300 comprising a plurality of stacked sensor layers, in accordance with one or more embodiments. The sensor assembly 300 may be an embodiment of the sensor device 130 in FIG. 1A, and an embodiment of the sensor assembly 200 in FIG. 2. In some embodiments, a photodetector layer 305 may be positioned on top of the sensor assembly 300 and may comprise an array of pixels 310, e.g., a two-dimensional array of photodiodes. As processing circuitry of the sensor assembly 300 can be integrated into other layers beneath the photodetector layer 305, the photodetector layer 305 can be customized only for photo-detection. Thus, an area of the photodetector layer 305 can be relatively small and the photodetector layer 305 may dissipate a limited amount of power. In some embodiments, an ADC layer 315 customized for conversion of analog signals (e.g., intensities of light captured by the photodetector layer 305) into digital data may be placed immediately beneath the photodetector layer 305. The ADC layer 315 may be configured to convert (e.g., by its processing circuitry or ADC logic, details not shown in FIG. 3) analog values of light intensities captured by the pixels 310 of the photodetector layer 305 into digital values corresponding to, e.g., image frame data. The ADC layer 315 may also include a memory (not shown in FIG. 3) for storing the digital values obtained after the conversion.

In some embodiments, a feature extraction layer 320 with processing circuitry customized for feature extraction may be placed immediately beneath the ADC layer 315. The feature extraction layer 320 may also include a memory for storing, e.g., digital sensor data generated by the ADC layer 315. The feature extraction layer 320 may be configured to extract one or more features from the digital sensor data obtained from the ADC layer 315. As the feature extraction layer 320 is customized for extracting specific features, the feature extraction layer 320 may be efficiently designed to occupy a small area size and dissipate a limited amount of power. More details about the feature extraction layer 320 are provided in conjunction with FIG. 4.

In some embodiments, a convolutional neural network (CNN) layer 325 may be placed immediately beneath the feature extraction layer 320. A neural network logic of the CNN layer 325 may be trained and optimized for particular input data, e.g., data with information about a specific feature or a set of features obtained by the feature extraction layer 320. As the input data are fully expected, the neural network logic of the CNN layer 325 may be efficiently implemented and customized for a specific type of feature extraction data, resulting into a reduced processing latency and lower power dissipation.

In some embodiments, the CNN layer 325 is designed to perform image classification and recognition applications. Training of the neural network logic of the CNN layer 325 may be performed offline, and network weights in the neural network logic of the CNN layer 325 may be trained prior to utilizing the CNN layer 325 for image classification and recognition. In one or more embodiments, the CNN layer 325 is implemented to perform inference, i.e., to apply the trained network weights to an input image to determine an output, e.g., an image classifier. In contrast to designing a generic CNN architecture, the CNN layer 325 may be implemented as a custom and dedicated neural network, and can be designed for a preferred level of power dissipation, area size and efficiency (computational speed). Details about a specific implementation of the CNN layer 325 are provided in conjunction with FIG. 5.

In some embodiments, each sensor layer 305, 315, 320, 325 in the sensor assembly 300 customized for a particular processing task can be implemented using silicon-based technology. Alternatively, at least one of the sensor layers 305, 315, 320, 325 may be implemented based on a non-silicon photo-detection material, e.g., OPF photo-detection material and/or QD photo-detection material. In some embodiments, instead of the silicon-based photodetector layer 305 that includes the array of pixels 310 based on photodiodes, a non-silicon photodetector layer 330 can be placed on top of the sensor assembly 300. In one embodiment, the non-silicon photodetector layer 330 is implemented as a photodetector layer of QD photo-detection material, and can be referred to as a QD photodetector layer. In other embodiment, the non-silicon photodetector layer 330 is implemented as a photodetector layer of OPF photo-detection material, and can be referred to as an OPF photodetector layer. In yet other embodiment, more than one photodetector layer can be used for photo detection in the sensor assembly 300, e.g., at least one silicon-based photodetector layer 305 and at least one non-silicon based photodetector layer 330.

In some embodiments, a direct copper bonding can be used for inter-layer coupling between the photodetector layer 305 and the ADC layer 315. As shown in FIG. 3, a copper pad 335 may be used as an interface between a pixel 310 in the photodetector layer 305 and processing circuitry (ADC logic) of the ADC layer 315. For example, in the case of photodetector layer 305 implemented as a 20M-pixel camera, up to approximately 20 Mega copper pad connections 335 may be implemented between the photodetector layer 305 and the processing circuitry of the ADC layer 315. Note that a pitch of the photodetector layer 305 can be relatively small, e.g., between approximately 1 µm and 2 µm.

In some embodiments, as discussed, interconnection between sensor layers located in the sensor assembly 300 beneath the photodetector layer 305 can be achieved using, e.g., TSV technology. As shown in FIG. 3, a TSV interface 340 may interconnect the ADC logic/memory of the ADC layer 315 with the feature extraction logic of the feature extraction layer 320. The TSV interface 340 may provide digital sensor data obtained by the ADC layer 315 to the feature extraction layer 320 for extraction of one or more specific features, wherein the digital sensor data can be related to image data captured by the photodetector layer 305. Similarly, another TSV interface 345 may be used to interconnect the feature extraction logic of the feature extraction layer 320 with the neural network logic of the CNN layer 325. The TSV interface 345 may provide feature extraction data obtained by the feature extraction logic of the feature extraction layer 320 as inputs into the neural network logic of the CNN layer 325 for, e.g., image classification and/or recognition.

In some embodiments, an optical assembly 350 may be positioned on top of the silicon-based photodetector layer 305 (or the non-silicon based photodetector layer 330). The optical assembly 350 may be configured to direct at least a portion of light reflected from one or more objects in a local area surrounding the sensor assembly 300 to the pixels 310 of the silicon-based photodetector layer 305 (or sensor elements of the non-silicon based photodetector layer 330). In some embodiments, the optical assembly 350 can be implemented by stacking one or more layers of wafers (not shown in FIG. 3) on top of the silicon-based photodetector layer 305 (or the non-silicon based photodetector layer 330). Each wafer of the optical assembly 350 may be implemented as a glass wafer and represents an individual lens element of the optical assembly 350. In one or more embodiments, a polymer-based material can be molded on a top surface and/or a bottom surface of the glass wafer to serve as a reflective surface of the individual lens element of the optical assembly 350. This technology can be referred to as the wafer level optics. Additionally, a spacer (not shown in FIG. 3) can be included between a pair of adjacent glass wafers (layers) in the optical assembly 350 to adjust a space between the adjacent glass layers.

In some embodiments, all glass wafers of the optical assembly 350 and all silicon wafers of the sensor layers 305, 315, 320, 325 can be manufactured and stacked together before each individual sensor-lens unit is diced from a wafer stack to obtain one instantiation of the sensor assembly 300. Once the manufacturing is finished, each cube obtained from the wafer stack becomes a complete, fully functional camera, e.g., the sensor assembly 300 of FIG. 3. It should be understood that the sensor assembly 300 does not require any plastic housing for the sensor layers 305, 315, 320, 325, which facilitates implementing the sensor assembly 300 as a cube of a predefined volume size smaller than a threshold volume.

In some embodiments, when the non-silicon based photodetector layer 330 (e.g., QD photodetector layer or OPF photodetector layer) is part of the sensor assembly 300, the non-silicon based photodetector layer 330 may be directly coupled to the ADC layer 315. Electrical connections between sensor elements (pixels) in the non-silicon based photodetector layer 330 and the ADC layer 315 may be made as copper pads. In this case, the non-silicon based photodetector layer 330 can be deposited on the ADC layer 315 after all the other sensor layers 315, 320, 325 are stacked. After the non-silicon based photodetector layer 330 is deposited on the ADC layer 315, the optical assembly 350 is applied on top of the non-silicon based photodetector layer 330.

Figure 4:
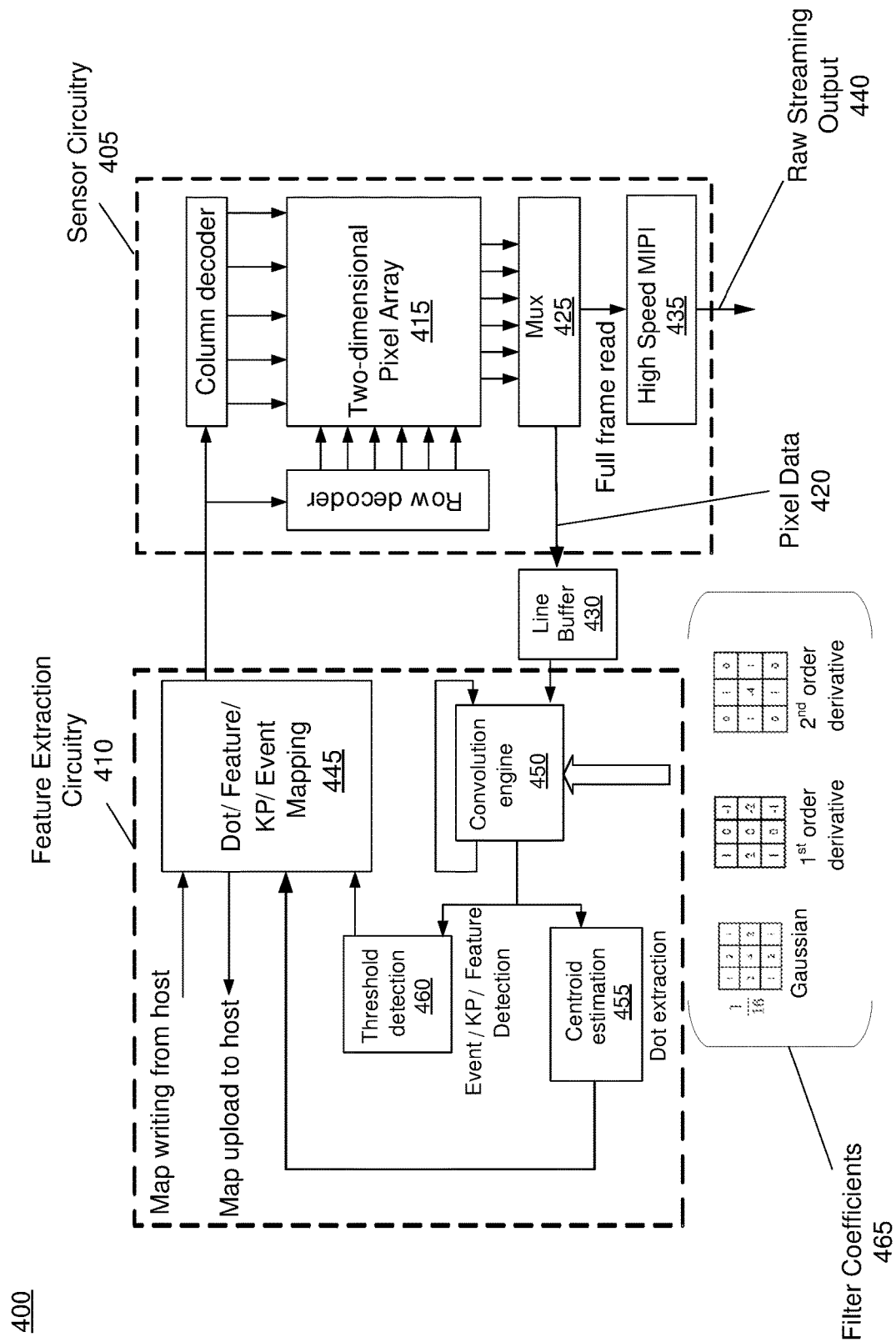
FIG. 4 is an example sensor architecture that consists of coupled sensor layers, which may be part of the stacked sensor system in FIG. 2, in accordance with one or more embodiments.

FIG. 4 is an example sensor architecture 400 of coupled sensor layers in a stacked sensor assembly, in accordance with one or more embodiments. The sensor architecture 400 may include sensor circuitry 405 coupled to feature extraction circuitry 410, e.g., via TSV interface. The sensor architecture 400 may be implemented as part of at least two sensor layers of the sensor assembly 300 in FIG. 3. In some embodiments, the sensor circuitry 405 may be part of the photodetector layer 305 and the ADC layer 315, whereas the feature extraction circuitry 410 may be part of the feature extraction layer 320.

The sensor circuitry 405 may acquire and pre-process sensor data, before providing the acquired sensor data to the feature extraction circuitry 410, e.g., via TSV interface. The sensor data may correspond to an image captured by a two-dimensional array of pixels 415, e.g., M×N array of digital pixels, where M and N are integers of same or different values. Note that the two-dimensional array of pixels 415 may be part of the photodetector layer 305 of the sensor assembly 300 of FIG. 3. Furthermore, the two-dimensional array of pixels 415 may include per pixel interface with ADC logic (not shown in FIG. 4), which may be part of the ADC layer 315 of FIG. 3. Pixel data 420 from an output of a multiplexer 425 may include digital sensor data related to the captured image. The pixel data 420 may be stored into a line buffer 430 and provided, e.g., via TSV interface, to the feature extraction circuitry 410 for extraction of one or more specific features. Note that a full frame read from the multiplexer 425 may be output via a high speed Mobile Industry Processor Interface (MIPI) 435 for producing a raw streaming output 440.

The feature extraction circuitry 410 may determine one or more features from the captured image represented by the pixel data 420. In the illustrative embodiment of FIG. 4, the feature extraction circuitry 410 includes a Dot/Feature/Key Point (KP)/Event mapping block 445, a convolution engine 450, a centroid estimation block 455, and a threshold detection block 460. The convolution engine 450 may process the pixel data 420 buffered in the line buffer 430 by applying, e.g., 3×3 convolution using various filter coefficients (kernels) 465, such as filter coefficients 465 for Gaussian filter, first order derivative, second order derivative, etc. The filtered data from the convolution engine 450 may be further fed into the threshold detection block 460 where a particular key feature or event in the captured image can be detected based on, e.g., filter and threshold settings. Location of the key feature/event determined by the threshold detection block 460 may be written into the mapping block 445. A map of one or more key features I events may be uploaded to, e.g., a host (not shown in FIG. 4); another map of key feature(s)/event(s) may be also written from the host to the mapping block 445. In an embodiment, the sensor architecture 400 can be used to measure depth information in a scene based on the structured light principle. In this case, a laser dot centroid can be extracted from the centroid estimation block 455, and the centroid may be written into the mapping block 445.

It should be understood that the sensor architecture 400 shown in FIG. 4 represent the illustrative embodiment. Other embodiments of the sensor circuitry 405 and/or the feature extraction circuitry 410 may include different and/or and additional processing blocks.

Figure 5:
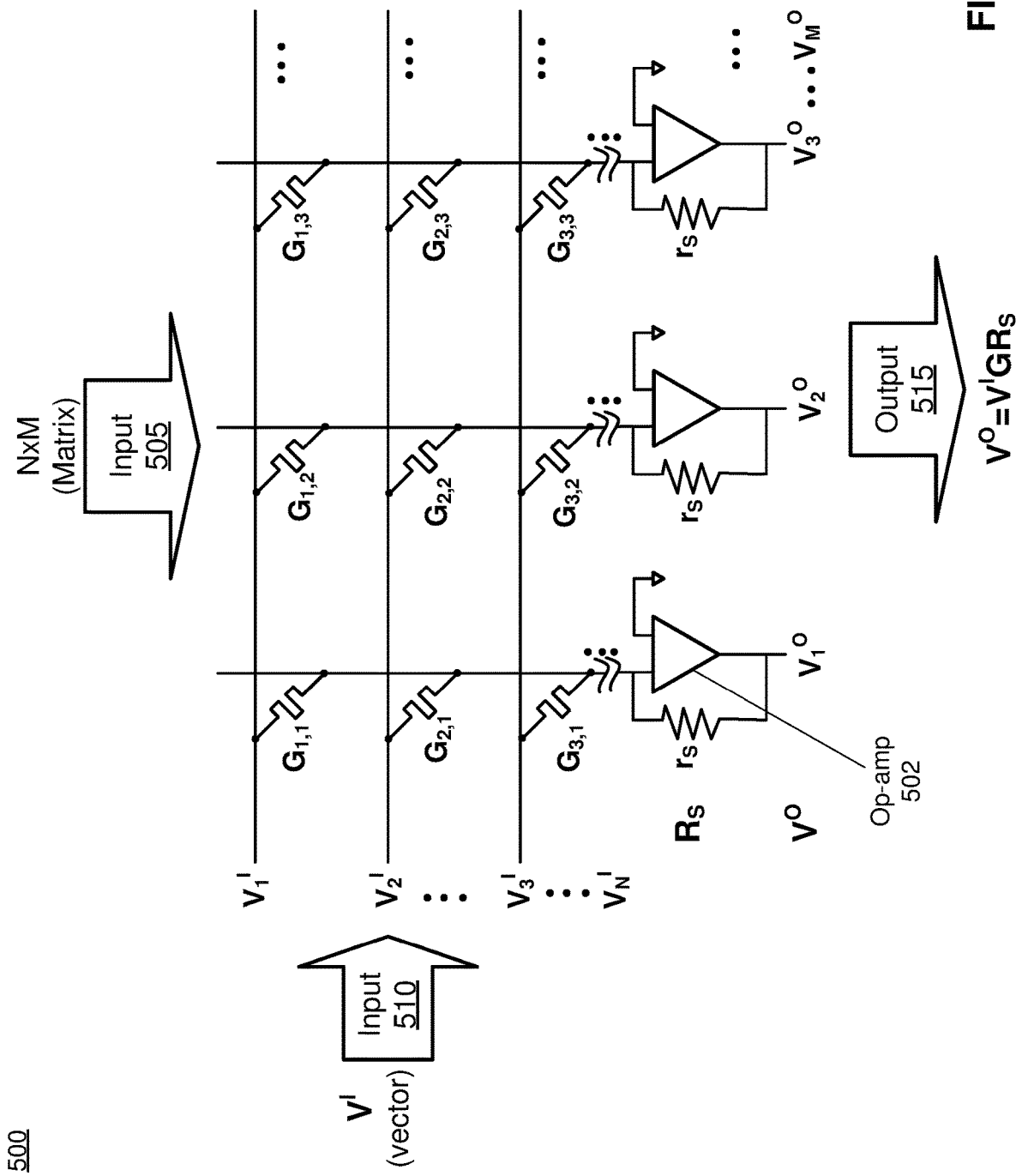
FIG. 5 is an example of a neural network based on an array of memristors, which may be part of the stacked sensor system in FIG. 2, in accordance with one or more embodiments.

FIG. 5 illustrates an example of a neural network 500 based on an array of memristors, in accordance with one or more embodiments. The neural network 500 may be an embodiment of the neural network logic in the CNN layer 325 of the sensor assembly 300 of FIG. 3. In some embodiments, the neural network 500 represents a CNN that is trained and utilized for certain processing based on machine learning algorithms, e.g., for image classification and/or recognition. Note that the feature extraction circuitry 410 of FIG. 4 and the neural network 500 can co-exist in an intelligent sensor system (e.g., the sensor assembly 300 of FIG. 3) as more traditional computer vision algorithms, e.g., for depth extraction can be implemented on the feature extraction circuitry 410.

In some embodiments, the neural network 500 may be optimized for neuromorphic computing having a memristor crossbar suitable for performing vector-matrix multiplication. Learning in the neural network 500 is represented in accordance with a set of parameters that include values of conductance $G=G_{n,m}$ (n=1, 2, =N; m=1, 2, . . . , M) and resistance Rs (e.g., vector of M resistance values rs) at cross-bar points of the neural network 500. An op-amp 502 and its associated resistor rs serves as an output driver and a column-wise weighting coefficient of each column of memristor elements, respectively.

In some embodiments, instead of fetching parameters from, e.g., a dynamic random-access memory (DRAM), the parameters in the form of conductance and resistance values are directly available at the cross-bar points of the neural network 500 and can be directly used during computation, e.g., during the vector-matrix multiplication. The neural network 500 based on the memristor crossbar shown in FIG. 5 can have a dual function, i.e., the neural network 500 can be employed as a memory storage device and as a computational device. The neural network 500 can be thus referred to as a "compute in memory implementation" having a preferred level of power dissipation, area size and computational efficiency. The neural network 500 can efficiently replace combination of a memory storage device and a CPU, which makes the neural network 500 suitable for efficient implementation as part of the CNN layer 325 of the sensor assembly 300 of FIG. 3.

Initial weights of the neural network 500, $G_{n,m}$, can be written via an input 505 with values organized in, e.g., N rows and M columns, which may represent a matrix input. In one or more embodiments, the matrix input 505 may correspond to a kernel for a convolution operation. In some embodiments, an input 510 may correspond to digital pixel values of an image, e.g., captured by the photodetector layer 305 and processed by ADC layer 315 and the feature extraction layer 320 of the sensor assembly 300 of FIG. 3. The input 510 may include digital voltage values $V^1$ organized into a vector of e.g., N voltage values $V_1^1$, $V_2^1$, $V_3^1$, ..., $V_N^1$ During inference operation, the vector input 510 may be applied into the matrix input 505. An output 515 may be obtained as a result of multiplication between the vector input 510 and the matrix input 505, i.e., as a result of the vector-matrix multiplication. As shown in FIG. 5, the output 515 represents a vector of digital voltage values $V^O$, i.e., M voltage values $V_1^O$, $V_2^O$, $V_3^O$, ..., $V_M^1$, where $V^O = V^1 GRs$ The output vector $V^O$ may be used for inference functions, such as object classification.

In some embodiments, the neural network 500 can be efficiently interfaced with the photodetector layer 305, the ADC layer 315 and the feature extraction layer 320 of the sensor assembly 300 of FIG. 3, e.g., via the TSY interface 345 between the feature extraction layer 320 and the CNN layer 325 (i.e., the neural network 500). Furthermore, the neural network 500 implemented based on the memristor cross-bar may avoid parallel-to-serial and serial-to-parallel conversion of data, which simplifies implementation and increases processing speed. Alternatively, the neural network 500 may be used for image segmentation and sematic applications, which can be enabled with the memristor cross-bar of FIG. 5 with different sets of learned coefficients.

Figure 6:
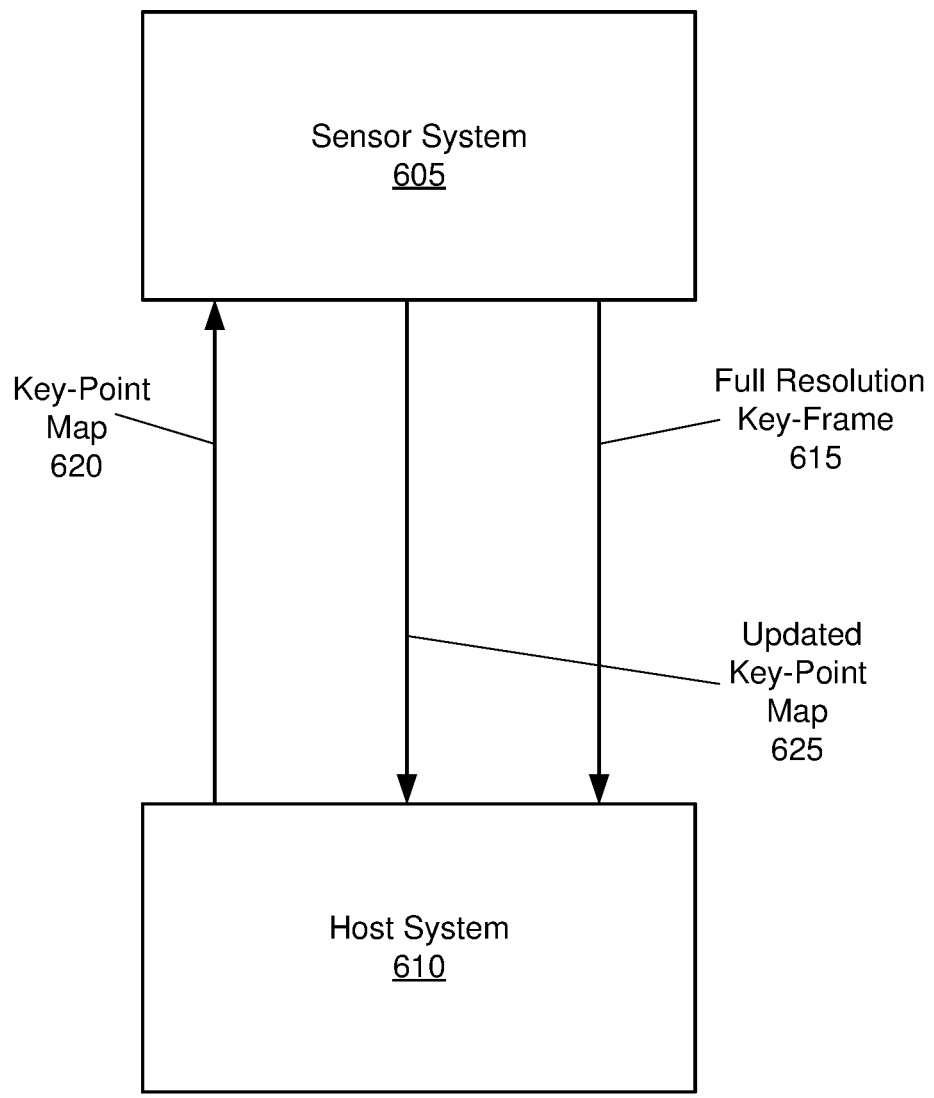
FIG. 6 is an example of a host-sensor closed loop system, in accordance with one or more embodiments.

FIG. 6 is an example of a host-sensor closed loop system 600, in accordance with one or more embodiment. The host-sensor closed loop system 600 includes a sensor system 605 and a host system 610. The sensor system 605 can be an embodiment of the sensor device 130 in FIG. 1A, an embodiment of the sensor assembly 200 in FIG. 2 and/or an embodiment of the sensor assembly 300 in FIG. 3; the host system 610 can be an embodiment of the controller 135 in FIG. 1A In some embodiments, the sensor system 605 may obtain one or more key features of e.g., a captured image of at least portion of an environment. The sensor system 605 may initially provide the one or more key features to the host system 610 as full resolution key-frame(s) 615 at a rate of, e.g., 10 frames per second. Based on the processed one or more full resolution key-frames 615, the host system 610 may be configured to predict one or more key points representing, e.g., future locations of the one or more key features in next image frame(s). The host system 610 may then provide a key-point map 620 to the sensor system 605 at a rate of, e.g., 10 frames per second.

After receiving the key-point map 620, the sensor system 605 may activate a portion of pixels, e.g., that correspond to a vicinity of the predicted feature(s). The sensor system 605 would then capture and process only those intensities of light related to the activated portion of pixels. By activating only the portion of pixels and processing only a portion of intensity values captured by the activated portion of pixels, power dissipated by the sensor system 605 can be reduced. The sensor system 605 may derive one or more updated locations of the one or more key features. The sensor system 605 may then send the one or more updated locations of the one or more key features to the host system 610 as an updated key-point map 625 at an increased rate of, e.g., 100 frames per second since the updated key-point map 625 includes less data than the full resolution key-frame 615. The host system 610 may then process the updated key-point map 625 having a reduced amount of data in comparison with the full resolution key-frame 615, which provides saving in power dissipated at the host system 610 while a computational latency at the host system 610 is also decreased. In this manner, the sensor system 605 and the host system 610 form the host-sensor closed loop system 600 with predictive sparse capture. The host-sensor closed loop system 600 provides power savings at both the sensor system 605 and the host system 610 with an increased communication rate between the sensor system 605 and the host system 610.

System Environment

Figure 7:
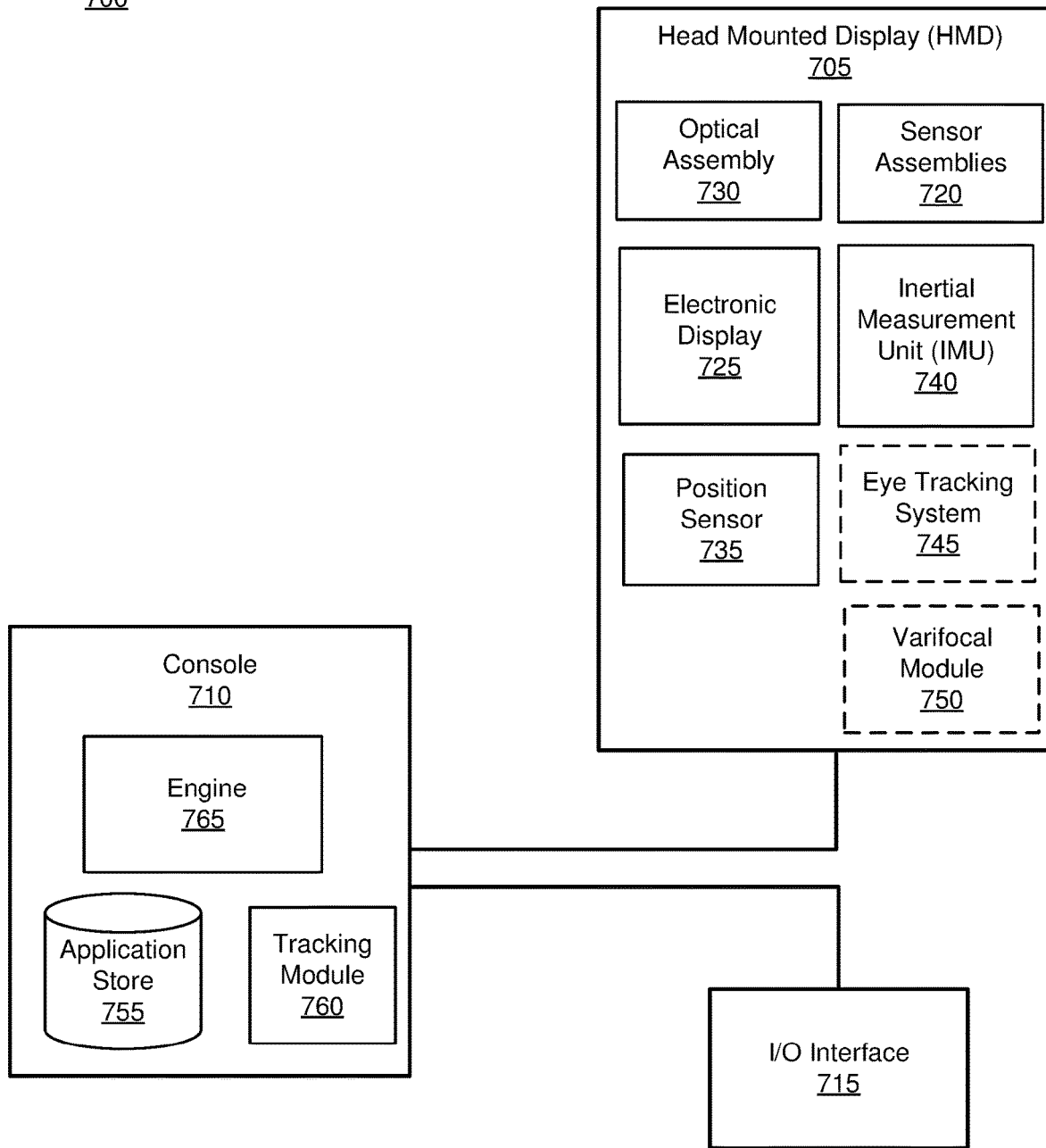
FIG. 7 is a block diagram of a HMD system in which a console operates, in accordance with one or more embodiments.

FIG. 7 is a block diagram of one embodiment of a HMD system 700 in which a console 710 operates. The HMD system 700 may operate in an artificial reality system. The HMD system 700 shown by FIG. 7 comprises a HMD 705 and an input/output (I/O) interface 715 that is coupled to the console 710. While FIG. 7 shows an example HMD system 700 including one HMD 705 and an I/O interface 715, in other embodiments any number of these components may be included in the HMD system 700. For example, there may be multiple HMDs 705 each having an associated I/O interface 715, with each HMD 705 and I/O interface 715 communicating with the console 710. In alternative configurations, different and/or additional components may be included in the HMD system 700. Additionally, functionality described in conjunction with one or more of the components shown in FIG. 7 may be distributed among the components in a different manner than described in conjunction with FIG. 7 in some embodiments. For example, some or all of the functionality of the console 710 is provided by the HMD 705.

The HMD 705 is a head-mounted display that presents content to a user comprising virtual and/or augmented views of a physical, real-world environment with computer-generated elements (e.g., two-dimensional (2D) or three-dimensional (3D) images, 2D or 3D video, sound, etc.). In some embodiments, the presented content includes audio that is presented via an external device (e.g., speakers and/or headphones) that receives audio information from the HMD 705, the console 710, or both, and presents audio data based on the audio information. The HMD 705 may comprise one or more rigid bodies, which may be rigidly or non-rigidly coupled together. A rigid coupling between rigid bodies causes the coupled rigid bodies to act as a single rigid entity. In contrast, a non-rigid coupling between rigid bodies allows the rigid bodies to move relative to each other. An embodiment of the HMD 705 may be the HMD 100 described above in conjunction with FIG. 1A.

The HMD 705 includes one or more sensor assemblies 720, an electronic display 725, an optical assembly 730, one or more position sensors 735, an IMU 740, an optional eye tracking system 745, and an optional varifocal module 750. Some embodiments of the HMD 705 have different components than those described in conjunction with FIG. 7. Additionally, the functionality provided by various components described in conjunction with FIG. 7 may be differently distributed among the components of the HMD 705 in other embodiments.

Each sensor assembly 720 may comprise a plurality of stacked sensor layers. A first sensor layer located on top of the plurality of stacked sensor layers may include an array of pixels configured to capture one or more images of at least a portion of light reflected from one or more objects in a local area surrounding some or all of the HMD 705. At least one other sensor layer of the plurality of stacked sensor layers located beneath the first (top) sensor layer may be configured to process data related to the captured one or more images. The HMD 705 or the console 710 may dynamically activate a first subset of the sensor assemblies 720 and deactivate a second subset of the sensor assemblies 720 based on, e.g., an application running on the HMD 705. Thus, at each time instant, only a portion of the sensor assemblies 720 would be activated. In some embodiments, information about one or more tracked features of one or more moving objects may be passed from one sensor assembly 720 to another sensor assembly 720, so the other sensor assembly 720 may continue to track the one or more features of the one or more moving objects.

In some embodiments, each sensor assembly 720 may be coupled to a host, i.e., a processor (controller) of the HMD 705 or the console 710. The sensor assembly 720 may be configured to send first data of a first resolution to the host using a first frame rate, the first data being associated with an image captured by the sensor assembly 720 at a first time instant. The host may be configured to send, using the first frame rate, information about one or more features obtained based on the first data received from the sensor assembly 720. The sensor assembly 720 may be further configured to send second data of a second resolution lower than the first resolution to the host using a second frame rate higher than the first frame rate, the second data being associated with another image captured by the sensor assembly at a second time instant.

Each sensor assembly 720 may include an interface connection between each pixel in the array of the top sensor layer and logic of at least one sensor layer of the one or more sensor layers located beneath the top sensor layer. At least one of the one or more sensor layers located beneath the top sensor layer of the sensor assembly 720 may include logic configured to extract one or more features from the captured one or more images. At least one of the one or more sensor layers located beneath the top sensor layer of the sensor assembly 720 may further include a CNN based on an array of memristors for storage of trained network weights.

At least one sensor assembly 720 may capture data describing depth information of the local area. The at least one sensor assembly 720 can compute the depth information using the data (e.g., based on a captured portion of a structured light pattern). Alternatively, the at least one sensor assembly 720 can send this information to another device such as the console 710 that can determine the depth information using the data from the sensor assembly 720. Each of the sensor assemblies 720 may be an embodiment of the sensor device 130 in FIG. 1A, the sensor assembly 200 in FIG. 2, the sensor assembly 300 in FIG. 3, and/or the sensor system 605 in FIG. 6.

The electronic display 725 displays two-dimensional or three-dimensional images to the user in accordance with data received from the console 710. In various embodiments, the electronic display 725 comprises a single electronic display or multiple electronic displays (e.g., a display for each eye of a user). Examples of the electronic display 725 include: a LCD, an OLED display, an ILED display, an AMOLED display, a TOLED display, some other display, or some combination thereof. The electronic display 725 may be an embodiment of the electronic display 155 in FIG. 1B.

The optical assembly 730 magnifies image light received from the electronic display 725, corrects optical errors associated with the image light, and presents the corrected image light to a user of the HMD 705. The optical assembly 730 includes a plurality of optical elements. Example optical elements included in the optical assembly 730 include: an aperture, a Fresnel lens, a convex lens, a concave lens, a filter, a reflecting surface, or any other suitable optical element that affects image light. Moreover, the optical assembly 730 may include combinations of different optical elements. In some embodiments, one or more of the optical elements in the optical assembly 730 may have one or more coatings, such as partially reflective or anti-reflective coatings.

Magnification and focusing of the image light by the optical assembly 730 allows the electronic display 725 to be physically smaller, weigh less and consume less power than larger displays. Additionally, magnification may increase the field-of-view of the content presented by the electronic display 725. For example, the field-of-view of the displayed content is such that the displayed content is presented using almost all (e.g., approximately 110 degrees diagonal), and in some cases all, of the field-of-view. Additionally in some embodiments, the amount of magnification may be adjusted by adding or removing optical elements.

In some embodiments, the optical assembly 730 may be designed to correct one or more types of optical error. Examples of optical error include barrel or pincushion distortions, longitudinal chromatic aberrations, or transverse chromatic aberrations. Other types of optical errors may further include spherical aberrations, chromatic aberrations or errors due to the lens field curvature, astigmatisms, or any other type of optical error. In some embodiments, content provided to the electronic display 725 for display is pre-distorted, and the optical assembly 730 corrects the distortion when it receives image light from the electronic display 725 generated based on the content. In some embodiments, the optical assembly 730 is configured to direct image light emitted from the electronic display 725 to an eye box of the HMD 705 corresponding to a location of a user's eye. The image light may include depth information for the local area determined by at least one of the plurality of sensor assemblies 720 based in part on the processed data. The optical assembly 730 may be an embodiment of the optical assembly 160 in FIG. 1B.

The IMU 740 is an electronic device that generates data indicating a position of the HMD 705 based on measurement signals received from one or more of the position sensors 735 and from depth information received from the at least one sensor assembly 720. A position sensor 735 generates one or more measurement signals in response to motion of the HMD 705. Examples of position sensors 735 include: one or more accelerometers, one or more gyroscopes, one or more magnetometers, another suitable type of sensor that detects motion, a type of sensor used for error correction of the IMU 740, or some combination thereof. The position sensors 735 may be located external to the IMU 740, internal to the IMU 740, or some combination thereof.

Based on the one or more measurement signals from one or more position sensors 735, the IMU 740 generates data indicating an estimated current position of the HMD 705 relative to an initial position of the HMD 705. For example, the position sensors 735 include multiple accelerometers to measure translational motion (forward/back, up/down, left/right) and multiple gyroscopes to measure rotational motion (e.g., pitch, yaw, roll). In some embodiments, the position sensors 735 may represent the position sensors 135 of FIG. 1A In some embodiments, the IMU 740 rapidly samples the measurement signals and calculates the estimated current position of the HMD 705 from the sampled data. For example, the IMU 740 integrates the measurement signals received from the accelerometers over time to estimate a velocity vector and integrates the velocity vector over time to determine an estimated current position of a reference point on the HMD 705. Alternatively, the IMU 740 provides the sampled measurement signals to the console 710, which interprets the data to reduce error. The reference point is a point that may be used to describe the position of the HMD 705. The reference point may generally be defined as a point in space or a position related to the HMD's 705 orientation and position.

The IMU 740 receives one or more parameters from the console 710. The one or more parameters are used to maintain tracking of the HMD 705. Based on a received parameter, the IMU 740 may adjust one or more IMU parameters (e.g., sample rate). In some embodiments, certain parameters cause the IMU 740 to update an initial position of the reference point so it corresponds to a next position of the reference point. Updating the initial position of the reference point as the next calibrated position of the reference point helps reduce accumulated error associated with the current position estimated the IMU 740. The accumulated error, also referred to as drift error, causes the estimated position of the reference point to "drift" away from the actual position of the reference point over time. In some embodiments of the HMD 705, the IMU 740 may be a dedicated hardware component. In other embodiments, the IMU 740 may be a software component implemented in one or more processors. In some embodiments, the IMU 740 may represent the IMU 130 of FIG. 1A.

In some embodiments, the eye tracking system 745 is integrated into the HMD 705. The eye tracking system 745 determines eye tracking information associated with an eye of a user wearing the HMD 705. The eye tracking information determined by the eye tracking system 745 may comprise information about an orientation of the user's eye, i.e., information about an angle of an eye-gaze. In some embodiments, the eye tracking system 745 is integrated into the optical assembly 730. An embodiment of the eye-tracking system 745 may comprise an illumination source and an imaging device (camera).

In some embodiments, the varifocal module 750 is further integrated into the HMD 705. The varifocal module 750 may be coupled to the eye tracking system 745 to obtain eye tracking information determined by the eye tracking system 745. The varifocal module 750 may be configured to adjust focus of one or more images displayed on the electronic display 725, based on the determined eye tracking information obtained from the eye tracking system 745. In this way, the varifocal module 750 can mitigate vergence-accommodation conflict in relation to image light. The varifocal module 750 can be interfaced (e.g., either mechanically or electrically) with at least one of the electronic display 725, and at least one optical element of the optical assembly 730. Then, the varifocal module 750 may be configured to adjust focus of the one or more images displayed on the electronic display 725 by adjusting position of at least one of the electronic display 725 and the at least one optical element of the optical assembly 730, based on the determined eye tracking information obtained from the eye tracking system 745. By adjusting the position, the varifocal module 750 varies focus of image light output from the electronic display 725 towards the user's eye. The varifocal module 750 may be also configured to adjust resolution of the images displayed on the electronic display 725 by performing foveated rendering of the displayed images, based at least in part on the determined eye tracking information obtained from the eye tracking system 745. In this case, the varifocal module 750 provides appropriate image signals to the electronic display 725. The varifocal module 750 provides image signals with a maximum pixel density for the electronic display 725 only in a foveal region of the user's eye-gaze, while providing image signals with lower pixel densities in other regions of the electronic display 725. In one embodiment, the varifocal module 750 may utilize the depth information obtained by the at least one sensor assembly 720 to, e.g., generate content for presentation on the electronic display 725.

The I/O interface 715 is a device that allows a user to send action requests and receive responses from the console 710. An action request is a request to perform a particular action. For example, an action request may be an instruction to start or end capture of image or video data or an instruction to perform a particular action within an application. The I/O interface 715 may include one or more input devices. Example input devices include: a keyboard, a mouse, a game controller, or any other suitable device for receiving action requests and communicating the action requests to the console 710. An action request received by the I/O interface 715 is communicated to the console 710, which performs an action corresponding to the action request. In some embodiments, the I/O interface 715 includes an IMU 740 that captures IMU data indicating an estimated position of the I/O interface 715 relative to an initial position of the I/O interface 715. In some embodiments, the I/O interface 715 may provide haptic feedback to the user in accordance with instructions received from the console 710. For example, haptic feedback is provided when an action request is received, or the console 710 communicates instructions to the I/O interface 715 causing the I/O interface 715 to generate haptic feedback when the console 710 performs an action.

The console 710 provides content to the HMD 705 for processing in accordance with information received from one or more of: the at least one sensor assembly 720, the HMD 705, and the I/O interface 715. In the example shown in FIG. 7, the console 710 includes an application store 755, a tracking module 760, and an engine 765. Some embodiments of the console 710 have different modules or components than those described in conjunction with FIG. 7. Similarly, the functions further described below may be distributed among components of the console 710 in a different manner than described in conjunction with FIG. 7.

The application store 755 stores one or more applications for execution by the console 710. An application is a group of instructions, that when executed by a processor, generates content for presentation to the user. Content generated by an application may be in response to inputs received from the user via movement of the HMD 705 or the I/O interface 715. Examples of applications include: gaming applications, conferencing applications, video playback applications, or other suitable applications.

The tracking module 760 calibrates the HMD system 700 using one or more calibration parameters and may adjust one or more calibration parameters to reduce error in determination of the position of the HMD 705 or of the I/O interface 715. For example, the tracking module 760 communicates a calibration parameter to the at least one sensor assembly 720 to adjust the focus of the at least one sensor assembly 720 to more accurately determine positions of structured light elements captured by the at least one sensor assembly 720. Calibration performed by the tracking module 760 also accounts for information received from the IMU 740 in the HMD 705 and/or an IMU 740 included in the I/O interface 715. Additionally, if tracking of the HMD 705 is lost (e.g., the at least one sensor assembly 720 loses line of sight of at least a threshold number of structured light elements), the tracking module 760 may re-calibrate some or all of the HMD system 700.

The tracking module 760 tracks movements of the HMD 705 or of the I/O interface 715 using information from the at least one sensor assembly 720, the one or more position sensors 735, the IMU 740 or some combination thereof. For example, the tracking module 750 determines a position of a reference point of the HMD 705 in a mapping of a local area based on information from the HMD 705. The tracking module 760 may also determine positions of the reference point of the HMD 705 or a reference point of the I/O interface 715 using data indicating a position of the HMD 705 from the IMU 740 or using data indicating a position of the I/O interlace 715 from an IMU 740 included in the I/O interface 715, respectively. Additionally, in some embodiments, the tracking module 760 may use portions of data indicating a position or the HMD 705 from the IMU 740 as well as representations of the local area from the at least one sensor assembly 720 to predict a future location of the HMD 705. The tracking module 760 provides the estimated or predicted future position of the HMD 705 or the I/O interface 715 to the engine 755.

The engine 765 generates a 3D mapping of the local area surrounding some or all of the HMD 705 based on information received from the HMD 705. In some embodiments, the engine 765 determines depth information for the 3D mapping of the local area based on information received from the at least one sensor assembly 720 that is relevant for techniques used in computing depth. The engine 765 may calculate depth information using one or more techniques in computing depth from structured light. In various embodiments, the engine 765 uses the depth information to, e.g., update a model of the local area, and generate content based in part on the updated model.

The engine 765 also executes applications within the HMD system 700 and receives position information, acceleration information, velocity information, predicted future positions, or some combination thereof, of the HMD 705 from the tracking module 760. Based on the received information, the engine 765 determines content to provide to the HMD 705 for presentation to the user. For example, if the received information indicates that the user has looked to the left, the engine 765 generates content for the HMD 705 that mirrors the user's movement in a virtual environment or in an environment augmenting the local area with additional content. Additionally, the engine 765 performs an action within an application executing on the console 710 in response to an action request received from the I/O interface 715 and provides feedback to the user that the action was performed. The provided feedback may be visual or audible feedback via the HMD 705 or haptic feedback via the I/O interface 715.

In some embodiments, based on the eye tracking information (e.g., orientation of the user's eye) received from the eye tracking system 745, the engine 765 determines resolution of the content provided to the HMD 705 for presentation to the user on the electronic display 725. The engine 765 provides the content to the HMD 705 having a maximum pixel resolution on the electronic display 725 in a foveal region of the user's gaze, whereas the engine 765 provides a lower pixel resolution in other regions of the electronic display 725, thus achieving less power consumption at the HMD 705 and saving computing cycles of the console 710 without compromising a visual experience of the user. In some embodiments, the engine 765 can further use the eye tracking information to adjust where objects are displayed on the electronic display 725 to prevent vergence-accommodation conflict.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
an array of pixel cells configured to capture one or more first images; and
a processing circuit configured to:
extract features of one or more objects from the one or more first images; and
enable a subset of the array of pixel cells based on the features to capture one or more second images of the one or more objects.

2. The apparatus of claim 1, wherein the processing circuit is configured to:
transmit first information related to the features to a host device;
receive, from the host device, second information related to the subset of the array of pixel cells; and
enable the subset of the array of pixel cells based on the second information.

3. The apparatus of claim 2, wherein the first information includes one or more pixel locations of the features in the one or more first images; and
wherein the second information includes expected pixel locations of the features in the one or more second images.

4. The apparatus of claim 2, wherein the processing circuit is configured to receive, from the host device, third information indicating expected pixel locations of the features in the one or more first images; and
extract the features from the one or more first images based on the third information.

5. The apparatus of claim 2, wherein the processing circuit is configured to receive the first information at a first frame rate and to transmit the second information at a second frame rate; and
wherein the first frame rate is lower than the second frame rate.

6. The apparatus of claim 1, wherein the processing circuit is configured to extract the features from the one or more first images based on at least one of: extracting dots based on a centroid estimation operation, or extracting keys or events based on a threshold detection operation.

7. The apparatus of claim 1, wherein the processing circuit is configured to:
perform a convolution operation on the one or more first images to generate filtered one or more first images; and
extract the features from the filtered one or more first images.

8. The apparatus of claim 1, wherein the processing circuit is configured to determine depth information for the one or more objects based on the features.

9. The apparatus of claim 1, wherein the processing circuit is configured to determine content information based on the features.

10. The apparatus of claim 1, wherein the processing circuit is further configured to implement a convolutional neural network (CNN).

11. The apparatus of claim 10, wherein the CNN is configured to determine whether the one or more first images include the one or more objects based on the features.

12. The apparatus of claim 10, wherein the CNN is configured to perform a convolution operation on the one or more first images.

13. The apparatus of claim 10, wherein the processing circuit comprises an array of memristors configured to store a set of neural network weights of the CNN.

14. The apparatus of claim 1, wherein the array of pixel cells is formed in a sensor layer;
wherein the processing circuit is formed in one or more processing circuit layers; and
wherein the sensor layer and the one or more processing circuit layers form a stack structure.

15. The apparatus of claim 14, wherein the sensor layer comprises at least one of: a Quantum Dot (QD) photodetector material, or an organic photonic film (OPF) photodetector material.

16. The apparatus of claim 14, wherein the one or more processing circuit layers comprises a first processing circuit layer and a second processing circuit layer forming part of the stack structure, the first processing circuit layer including a feature extraction circuit, the second processing circuit layer including a CNN;
wherein an interface connection between the sensor layer and the first processing circuit layer comprises copper pad connections; and
wherein the first processing circuit layer and the second processing circuit layer are electrically coupled using through silicon vias (TSV).

17. A mobile device comprising:
an sensor assembly comprising:
an array of pixel cells configured to capture one or more first images; and
a processing circuit configured to:
extract features of one or more objects from the one or more first images; and
enable a subset of the array of pixel cells based on the features to capture one or more second images of the one or more objects; and
an output device configured to output content, the content being generated based on the features.

18. The mobile device of claim 17, wherein the output device comprises an optical assembly configured to direct image light of the content to an eye box corresponding to a location of a user's eye.

19. The mobile device of claim 17, wherein the processing circuit further comprises a first circuit configured to implement a convolutional neural network (CNN).

20. The mobile device of claim 17, wherein the processing circuit is configured to:
transmit first information related to the features to a host device;
receive, from the host device, second information related to the subset of the array of pixel cells; and
enable the subset of the array of pixel cells based on the second information.

* * * * *